United States Patent [19]
Puyhaubert et al.

[11] 4,301,431
[45] Nov. 17, 1981

[54] MINIATURE DELAY LINE HAVING LOW DIRECT COUPLING

[75] Inventors: Jean Puyhaubert, St. Leu la Foret; Claude Jacquemin, Paris, both of France

[73] Assignee: Thomson-CSF, Paris, France

[21] Appl. No.: 133,885

[22] Filed: Mar. 25, 1980

[30] Foreign Application Priority Data

Mar. 29, 1979 [FR] France .................... 79 07889

[51] Int. Cl.³ .................... H03H 9/36; H03H 9/10; H03H 9/125
[52] U.S. Cl. .................... 333/141; 333/142; 333/143
[58] Field of Search .................... 333/141–149, 333/186–187, 12; 310/348, 344, 354

[56] References Cited

U.S. PATENT DOCUMENTS 2,727,214 12/1955 McSkimin .................... 333/141
3,465,177 9/1969 Winslow et al. .................... 333/141 X Primary Examiner—Marvin L. Nussbaum
Attorney, Agent, or Firm—Karl F. Ross

[57] ABSTRACT

In a miniaturized delay line constituted by a single crystal through which an ultrasonic beam passes and by two electroacoustic transducers, the direct coupling between the input and the output of the delay line is attenuated by means of a molded shielding element of araldite loaded with silver. The molded element is placed around the output transducer as well as the lead which connects the transducer to one of the connector-pins of the base of the casing containing the delay line.

5 Claims, 5 Drawing Figures

U.S. Patent
Nov. 17, 1981
4,301,431
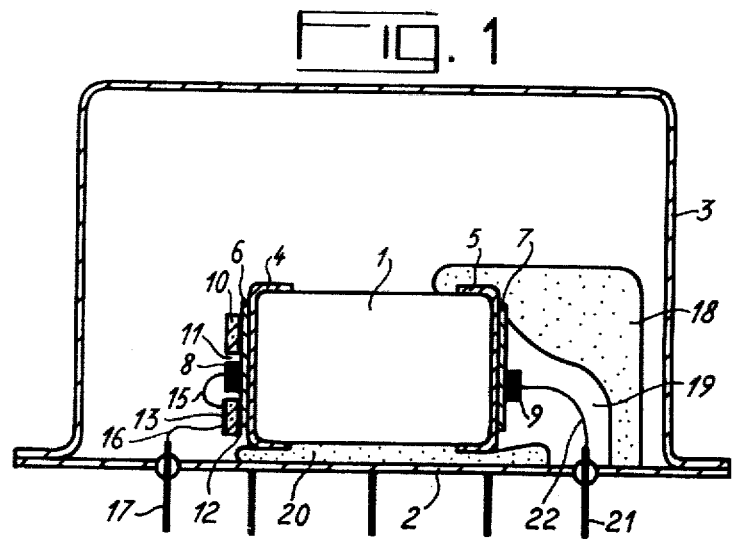
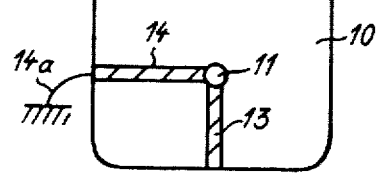
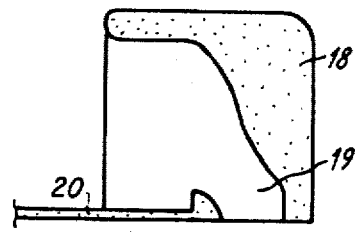
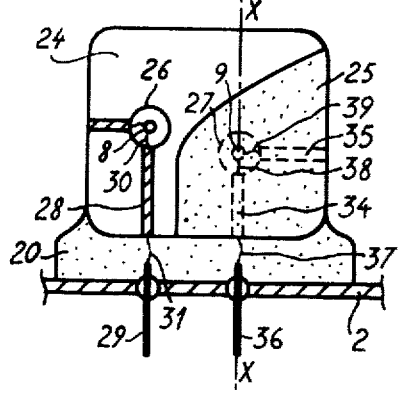
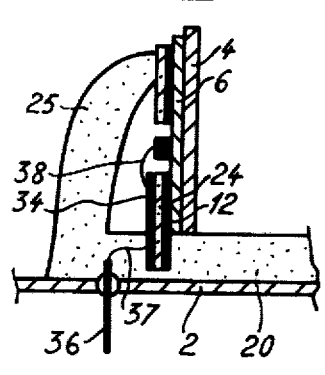

MINIATURE DELAY LINE HAVING LOW DIRECT COUPLING

BACKGROUND OF THE INVENTION

The invention relates to ultrasonic delay lines which operate in the microwave range. It is known practice to use a single-crystal medium such as a corundum bar for the fabrication of a delay line having a time delay of a few microseconds by placing an input transducer on a first end face in order to convert the electrical signal into an ultrasonic signal which propagates within the bar. The output transducer can be secured either to the opposite end face or to the same end face as the input transducer. The use of multiple reflections makes it possible to reduce the length of the bars to a considerable extent and to present the delay lines within a casing which is standardized by manufacturers of semi-conductor devices.

As disclosed in particular in French Pat. Nos. 2,239,812 and 2,241,166 filed by the present Assignee respectively on July 30, 1973 and Aug. 14, 1973, it is known that the reflecting faces of the acoustic wave propagation medium are formed in such a manner as to ensure that focusing of the wave and dispersion of the successive points of impact on the reflecting surface are carried out at the same time as reflection. By associating with this type of line a quasi-punctual transducer of the type described in French Pat. No. 2,094,443 filed on June 22, 1970 by the present Assignee, the delay lines obtained have long delay times as well as a relatively low insertion loss and are of small overall size compared with the size of single-reflection lines.

The miniaturization thus obtained helps the direct coupling between the input transducer and the output transducer, so that the output transducer provides a first direct signal having a level comprised between that of the first delayed echo and a value higher than 20 dB.

SUMMARY OF THE INVENTION

The aim of the present invention is to reduce the intensity of the signal transmitted by direct coupling.

The electroacoustic delay line according to the invention comprises a medium for propagating the elastic wave emitted by an input transducer secured to one of the end faces of said medium and an output transducer, said delay line being placed within a standardized semiconductor component casing. The distinguishing feature of the delay line lies in the fact that provision is made for a conductive shielding element which surrounds at least said output transducer and its connection without being in contact therewith, said shielding element being maintained at a fixed potential.

The delay line according to the invention presents the following advantages:

- decoupling between the input and output transducers permits systematic use of an echo of high order, thus making it possible to limit the length of the crystal between 8 and 10 millimeters even in the case of delay times of several microseconds, thus ensuring a reduction both in overall size and cost of the line;
- the output transducer shield placed in an elastic-wave focusing zone makes it possible to obtain an output signal which is higher by 10 dB than the signal delivered by the single-reflection delay lines without focusing and to attenuate by more than 40 dB the signal transmitted by direct coupling, thereby removing any need to eliminate said signal in the delayed-signal utilization circuit.

BRIEF DESCRIPTION OF THE DRAWING

The invention is described hereinafter with reference to the accompanying drawings which are given by way of illustration and in which:

FIG. 1 is an enlarged sectional view of a delay line according to the invention which operates in transmission;

FIG. 2 illustrates the small input connection plate of a delay line according to FIG. 1;

FIG. 3 is a sectional view of the shielding element of the output transducer of a delay line according to FIG. 1;

FIG. 4 is a partial view of an alternative form of construction relating to a delay line which operates in reflection; and FIG. 5 is a part-sectional view of the delay line of FIG. 4.

DETAILED DESCRIPTION OF EMBODIMENTS

FIG. 1 illustrates a multiple-reflection delay line according to the invention which operates in transmission. The corundum crystal 1 is secured to the base 2 of a casing which is standardized for semiconductor devices such as the casing of type T08 (12), for example, said casing being closed by the cover 3 by means of a cradle 19 of polymerizable conductive material. Preferably, said cradle is rigidly fixed to a portion of a shell 18 which provides a shield for the output transducer 9 and its connection 22 as shown at 20. The shell 18 is in contact with a connector-pin 21 of the base 2 which is maintained at a fixed potential (usually ground potential, for example). It is possible to secure the crystal over its entire length without introducing any attenuation of acoustic energy, the latter being guided within the crystal under the focusing action of the reflecting faces. In the example shown in FIG. 1, the end faces of the crystal 1 which are machined in a view to ensuring a focusing of the reflected wave are each covered with a metallic layer designated respectively by the reference numeral 4 and 5, said layers being deposited by vacuum evaporation. The layers 4 and 5 are covered with stannic oxide layers 6 and 7 respectively which perform the function of transducers. Point electrodes 8 and 9 respectively are placed on the layers 6 and 7 and complete the input and output transducers; said electrodes are fabricated in the manner described in French Pat. No. 2,094,443 cited earlier. The transducer assembly will be designated hereinafter by the reference of its point electrode. A small insulating plate 10 pierced at 11 and metallized at 12 over one entire face is adapted to carry two rectilinear conductive strips 13 and 14 on the opposite face. Said conductive strips are disposed radially about the hole 11, thus forming in conjunction with the metallized face 12 two microstrip line sections having a characteristic impedance of 50 ohms. The small plate 10 is fixed on the periphery of the metallized face 12 and bonded to the stannic oxide layer 6, preferably by making use of the same polymerizable conductive material as the material employed for securing the crystal 1. Electrical continuity between the shell 20 and the metallized face 12 is ensured by means of the adhesive material.

FIG. 2 is a front view of the small plate 10. The hole 11 is pierced according to the desired position of the transducer 8 on the end face and is of distinctly larger size than said transducer. The microstrips 13 and 14 are disposed around the hole 11. The lower end of the microstrip 13 is connected to the connector-pin 17 via the lead 16 and said microstrip serves as an input circuit of the delay line. The other end of said microstrip 13 is connected to the transducer 8 via the lead 15. The impedance of the transducer 8 is usually lower than the standardized impedance (50 ohms) which has to be brought back to the line input. Matching of the input impedance is effected by means of the length of the microstrip 13 which may be associated with localized capacitances in the form of locally enlarged portions of the metallized face in accordance with well-known practice, in conjunction with a matching impedance constituted by the microstrip line section 14 which is connected at one end to the transducer 8 via a conductor (not shown) and at the other end to ground via a conductor of suitable length as shown diagrammatically at 14a. The ground is usually one point of the metallic deposit 12.

The second end of the crystal 1 which carries the output transducer 9 is surrounded by a shielding element 18 which covers the metallic deposit 5, the transducer 9 and its connection 22. Said shielding element is constituted by a massive conductive piece fabricated from polymerizable material which is capable of adhering to the shielding element 20. These elements are preferably fabricated from a suspension of silver in araldite paste marketed under the commercial designation H 20 E by the Epo-Tek Company of Watertown (Mass.) and polymerizable in the cold state.

FIG. 3 is a sectional view of the shielding element 18. Said element is made up of two symmetrical and separately molded portions each provided with a groove 19 having a semicircular cross-section. A first half of the shielding element 18 is placed against the element 20 for securing the crystal 1, the groove 19 being intended to free the end face in the vicinity of the transducer 9 and to terminate in the vicinity of the connector-pin 21. The half-shield is then attached to the base 2 and to the element 20 by means of araldite of the type mentioned earlier. The lead 22 is then placed in position in order to connect the transducer 9 to the end of the connector-pin 21. Matching of the output impedance is effected by employing a second microstrip line section connected between the transducer 9 and the reference potential via a conductor of matched length. The second portion of the shielding element 18 which is symmetrical with the portion shown in FIG. 3 is placed in position and in turn bonded with araldite as already mentioned. By way of alternative, the entire portion 18 of the shielding element can be molded in situ, the groove 19 being formed prior to application of the polymerizable material.

By way of illustration, a delay line equipped with a shielding element of the type hereinabove described within a casing of type TO8 (12) has been constructed, the characteristics of which are as follows:
  delay time: 7 microseconds, resulting from nine traversals between the end faces of the crystal;
  length of the crystal: 8 millimeters approx.;
  3 dB passband within the range of 1.2 to 1.8 GHz;
  insertion loss within the passband: less than 32 dB;
  attenuation of the direct signal between the input and the output: 70 dB (between the connector-pins 17 and 21).

FIG. 4 shows respectively at 24 and 25 an alternative form of construction of the small plate 10 and of the shielding element 18 employed in a line which operates in reflection. The small plate 24 is provided with two drilled holes 26 and 27 formed as a function of the respective positions of the transducers 8 and 9 on the end face of the crystal. A microstrip line section 28 which terminates at the hole 26 serves to connect the transducer 8 via leads 30 and 31 to the same connector-pin 29 of the base 2. Matching of the input impedance calls for the use of the line section 28 as explained earlier. The two microstrip line sections 34 and 35 terminate at the hole 27. The section 34 which is vertical serves to establish a connection between the transducer 9 and the connector-pin 36 of the base 2 by means of leads 37 and 38. The horizontal section 35 employed for matching the output impedance is connected to the transducer 9 via the lead 39.

FIG. 5 is a sectional view of the shielding element 25, this view being taken along a plane represented by the line X—X in FIG. 4. It is thus apparent that the shielding element 25 is constituted by a hollow shell which is applied against the small plate 24 in the central zone located between the two drilled holes 26 and 27, which is closed at the lower portion on the element 20 used for fixing the bar 1 on the base 2, and returns on the right-hand portion to the rear of the small plate 24 in order to establish a contact with the metallic deposit 12, the electrode 4 and the element 20 which serves to secure the bar 1. Electrical continuity between these different conductive elements is ensured by making use of a conductive adhesive. As in the previous alternative embodiment, the shell 25 can be fabricated from two molded half-shells which are bonded together by means of a conductive adhesive. The shape of the shell is chosen so as to free the holes 26 and 27 and to enclose the transducer 9 and its output lead as well as the section employed for matching. A certain number of conductors are embedded in the shell when the latter is molded and polymerized in situ as it is in the case with the conductor 37, for example. As in the previous alternative embodiment, the conductive element 20 for fixing the crystal 1 on the base 2 is in contact with a connector-pin which is maintained at a fixed potential.

By way of illustration, a delay line which operates in reflection has been constructed and has the following characteristics:
  delay time: 2.8 microseconds resulting from four traversals between the end faces of the crystal 1;
  length of the crystal 1: 8 millimeters approx.;
  passband at 3 dB within the range of 1.4 to 2.5 GHz;
  insertion loss: 35 dB at the center of the passband;
  attenuation of the direct signal: 60 dB (between the connector-pins 29 and 36);
  attenuation without shielding: 20 dB.

What is claimed is:
1. An electroacoustic delay line for providing focused multiple reflections comprising:
  an elastic-wave propagation medium shaped so as to present two opposite faces;
  an input transducer secured to one of said faces of said medium;
  an output transducer;
  a standardized semiconductor-component casing containing said delay line; and
  at least one shielding element in electrical contact with said casing, said shielding element being comprised of a molded shell surrounding without any contact said output transducer and its connection to said casing, said shell being bonded to a conduc- tive element for securing said medium to said casing, in contact with a connector-pin integral with said casing and maintained at a fixed potential.

2. A delay line as claimed in claim 1, wherein said shielding element is obtained by molding a polymerizable material which is made conductive by means of a metallic charge.

3. A delay line as claimed in claim 2, wherein said shielding element is attached to one of said faces of said medium and placed in electrical contact with said securing element by bonding with a conductive adhesive.

4. A delay line as claimed in claim 1, wherein said shell includes a number of portions bonded together with a conductive adhesive.

5. A delay line as claimed in claim 1, wherein bonding is carried out by means of the material which serves to form the shell.

* * * * *